United States Patent [19]

Takemae et al.

[11] Patent Number: 4,707,806
[45] Date of Patent: Nov. 17, 1987

[54] SEMICONDUCTOR INTEGRATED CIRCUIT DEVICE HAVING FUSE-TYPE INFORMATION STORING CIRCUIT

[75] Inventors: Yoshihiro Takemae, Tokyo; Tomio Nakano, Kawasaki; Takeo Tatematsu, Yokohama; Junji Ogawa, Tokyo; Takashi Horii, Kawasaki; Yasuhiro Fujii, Yokohama; Masao Nakano, Kawasaki, all of Japan; Norihisa Tsuge, deceased, late of Kamakura, Japan, by Itaru Tsuge, Sachie Tsuge, heirs

[73] Assignee: Fujitsu Limited, Kawasaki, Japan

[21] Appl. No.: 712,149

[22] Filed: Mar. 15, 1985

[30] Foreign Application Priority Data

Mar. 23, 1984 [JP] Japan ................. 59-055501

[51] Int. Cl.⁴ ............................. G11C 11/00
[52] U.S. Cl. ........................... 365/96; 365/94
[58] Field of Search ............ 365/96, 94, 182, 189

[56] References Cited

U.S. PATENT DOCUMENTS 4,250,570 2/1981 Tsang et al. ............... 365/200
4,432,070 2/1984 Moss ........................ 365/96
4,592,025 5/1986 Takemae .................. 365/200

Primary Examiner—Terrell W. Fears
Attorney, Agent, or Firm—Staas & Halsey

[57] ABSTRACT

A device connected between first and second voltage feed lines includes an information storing circuit having a fuse for storing information by blowing or not blowing the fuse, a voltage level conversion circuit connected to at least one of the first and second voltage feed lines and outputting a voltage lower than a voltage between the first and second voltage feed lines to the information storing circuit, and a circuit connected between the first and second voltage feed lines, for outputting a detection signal in response to a voltage value at the fuse in the information storing circuit to which the voltage is applied from the voltage level conversion circuit and which voltage value is varied with the blown or unblown state of the fuse.

In a normal operation, the voltage output from the voltage level conversion circuit can be set as low as possible to restrain electromigration caused at the vicinity of the blown portion of the fuse to which the voltage is applied, but higher than the threshold voltage of the information detection circuit.

15 Claims, 12 Drawing Figures

SEMICONDUCTOR INTEGRATED CIRCUIT DEVICE HAVING FUSE-TYPE INFORMATION STORING CIRCUIT

BACKGROUND OF THE INVENTION

The present invention relates to a semiconductor integrated circuit (IC) device, more particularly, to a semiconductor IC device including an information storing circuit using blown and unblown fuses for uses in a random access memory (RAM) device.

In a RAM device, a large number of memory cells are arranged along rows and columns. The density of defects generated in such a semiconductor memory device during the manufacture thereof is relatively independent of the integration density of the device. Rather, it derives from the semiconductor manufacturing technology. In general, the higher the integration density of the device, the greater the ratio of normal memory cells to defective memory cells. This is one of the advantages of increasing the integration density of a semiconductor memory device.

Even if a device includes only one defective memory cell, however, the device cannot be operated normally and, therefore, must be scrapped. As a result, despite the lower ratio of defective memory cells, greater integration density means reduced manufacturing yield.

To overcome the problem of defective memory cells, use is made of redundancy memory cells. When a defective memory cell is detected at the last stage of its manufacturing process by testing, it is electrically replaced by the redundancy memory cell. The replacement is effected for each row or column rather than each cell so that a redundancy memory cell row or column is selected instead of the memory cell row or column including the defective memory cell. In general, one or two redundancy memory cell rows or columns are usually provided.

In such a redundancy configuration, in order to store address information of such a defective row or column and to disable regular decoders for selecting normal memory cells so as to select the redundancy row or column in response to an address of the defective row or column, a redundancy control circuit is provided. A redundancy control circuit includes fuse-type read-only memories (ROM's) each having an information storing circuit.

A unit information storing circuit in prior art devices incorporates one fuse for each one bit of information to be stored (e.g., Electronics, July 28, 1981, p. 129 and p. 123). Therefore, the information storing circuit stores date "1" or "0" by a blown fuse or an unblown fuse. For example, upon completion of the major part of the manufacturing process of the device, and in the succeeding testing process wherein the defective rows or columns are detected and the writing data is determined, when writing data "1", a polycrystalline silicon fuse is blown by electrical programming or laser programming. However, as will be explained later in more detail, there is a relatively large probability of recovery of a polycrystalline silicon fuse from the blown to unblown state during the operation of the device, due to the particularities of the blowing phenomenon and the non-uniformity of shape of the blown fuse. For example, after blowing, the gap in the fuse establishing the disconnected state is often small (several 100 Å). The high voltage applied thereto creates a strong electric field which causes a slow "flow" of the conductive material. This eventually can cause a short-circuited state, i.e., an unblown state. Accordingly, there is also a relatively large probability of change of data stored in the information storing circuit from "1" to "0", thereby reducing the reliability of the information storing circuit.

SUMMARY OF THE INVENTION

It is an object of the present invention to provide a circuit for preventing the recovery of the blown fuse in the information storing circuit.

Is is another object of the present invention to provide a circuit which can investigate the blown fuse status and perform a screening test, acceleration test, or the like.

According to the present invention, there is provided a semiconductor IC device connected between first and second voltage feed lines including an information storing circuit having a fuse for storing information by blowing or not blowing the fuse, a voltage level conversion circuit connected to at least one of the first, for second voltage feed lines and outputting a voltage lower than a voltage between the first and second voltage feed lines to the information storing circuit, and a circuit connected between the first and second voltage feed lines, for outputting a detection signal in response to a voltage value at the fuse in the information storing circuit to which voltage is applied from the voltage level conversion circuit, which voltage value is varied with the blown or unblown state of the fuse.

Preferably, in normal operation, the voltage output from the voltage level conversion circuit is set as low as possible to restrain the recovery of the blown fuse caused at the vicinity of the blown portion of the fuse to which the voltage is applied, but higher than the threshold voltage of the information detection circuit.

It is further preferable that the voltage output from the voltage level conversion circuit be maintained at a predetermined value when the voltage between the first and second voltage feed lines is within a predetermined range and that the voltage output from the voltage level conversion circuit increase in response to the increment of the voltage between the first and second voltage feed lines when the voltage exceeds the predetermined range.

BRIEF DESCRIPTION OF THE DRAWINGS

Other objectives and features of the present invention will be described below in detail with reference to the accompanying drawings, in which.

DESCRIPTION OF THE PREFERRED EMBODIMENTS

Figure 1:
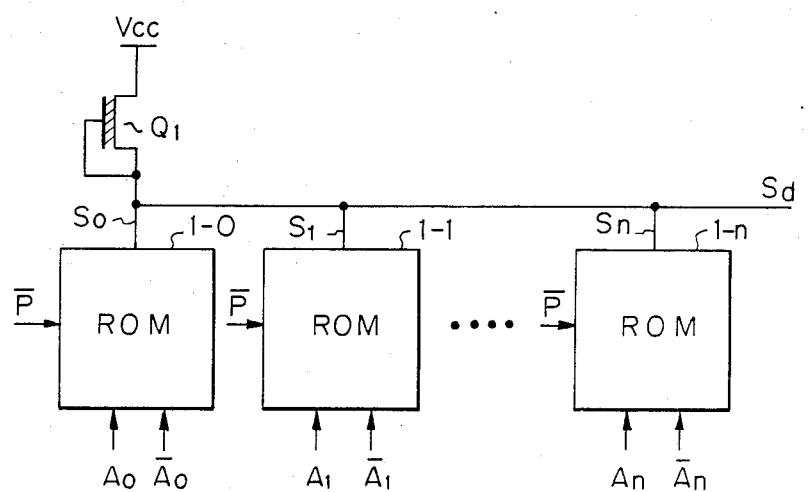
FIG. 1 is a block circuit diagram of a general redundancy control circuit.

FIG. 1 illustrates a general redundancy control circuit. The redundancy control circuit includes fuse-type ROM's 1-0, 1-1, ..., and 1-n each receiving address signals $A_0$, $\overline{A}_0$; $A_1$, $\overline{A}_1$; ... ; and $A_n$, $\overline{A}_n$, respectively. Each ROM includes one fuse which is blown or not blown in accordance with a corresponding one bit of information of an address corresponding to a defective row or column (hereinafter referred to as a defective address) and makes its internal logic switching transistor connected to one of the outputs $S_0$, $S_1$, ..., $S_n$ non-conductive upon coincidence of the information and its corresponding one bit of address signals. Therefore, when an input address defined by the address signals $A_0$, $\overline{A}_0$; $A_1$, $\overline{A}_1$; ... ; and $A_n$, $\overline{A}_n$ corresponds to the defective address, all the outputs $S_0$, $S_1$, ..., and $S_n$ of the ROM's 1-0, 1-1, ..., and 1-n become a high level, so that the output $S_d$ of the redundancy control circuit becomes a high level. In response to the high level of the output $S_d$, all the regular decoders (not shown) for the normal memory cells are disabled and, in addition, the redundancy row or column is selected. Conversely, when at least one pair of such address signals such as $A_0$ and $\overline{A}_0$ are different from the content stored in the ROM 1-0, its output $S_0$ becomes a low level. In this case, the conductivity of the depletion-type transistor $Q_1$ serving as a load is adjusted so that the output $S_d$ of the redundancy control circuit becomes a low level. As a result, the regular decoders for the normal memory cells are not disabled, and, in addition, the redundancy row or column is not selected. Thus, replacement of the defective normal memory cells by a redundancy row or column is carried out.

Before describing a preferred embodiment of the present invention, an explanation will be given of the prior art for reference.

Figure 2:
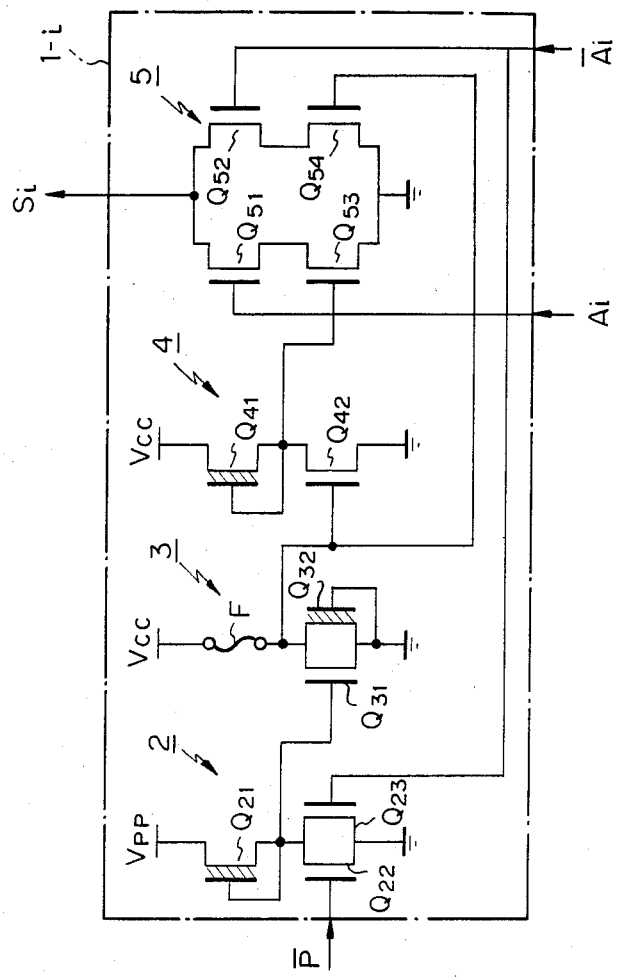
FIGS. 2 and 3 are circuit diagrams of a fuse-type ROM including a prior art information storing circuit.

An example of a prior art ROM 1-i, referring to the content of a prior art disclosure in Electronics, July 28, 1981, p. 129, is shown in FIG. 2. In FIG. 2, a programming circuit 2 includes a depletion-type transistor $Q_{21}$ serving as a load, an enhancement-type transistor $Q_{22}$ for receiving a program signal $\overline{P}$, and an enhancement-type transistor $Q_{23}$ for receiving an address signal $\overline{A}_i$. An information storing circuit 3 includes a fuse F, an enhancement-type transistor $Q_{31}$ turned on by the programming circuit 2, and a depletion-type transistor $Q_{32}$ serving as a load. An inverter 4 includes a depletion-type transistor $Q_{41}$ serving as a load and an enhancement-type transistor $Q_{42}$. An address coincidence detecting circuit 5 includes enhancement-type transistors $Q_{51}$ and $Q_{52}$ for receiving address signals $A_i$ and $\overline{A}_i$, respectively, an enhancement-type transistor $Q_{53}$ for receiving an output of the information storing circuit 3 via the inverter circuit 4, and an enhancement-type transistor $Q_{54}$ for receiving the output of the information storing circuit 3.

In FIG. 2, when the program signal $\overline{P}$ and the address $\overline{A}_i$ are both low, the transistor $Q_{31}$ is turned on so as to pass a large current to the fuse F, thereby blowing the fuse F. Thus, writing of data "1" is carried out. When the output of the information storing circuit 3 coincides with the address signals $A_i$ and $\overline{A}_i$, the address coincidence detecting circuit 5 generates a high level output signal $S_i$.

In FIG. 2, note $V_{PP} > V_{CC}$, in order to completely turn on the transistor $Q_{31}$ when the transistor $Q_{22}$ and $Q_{23}$ are both cut off, so that the fuse F can be easily blown.

Figure 3:
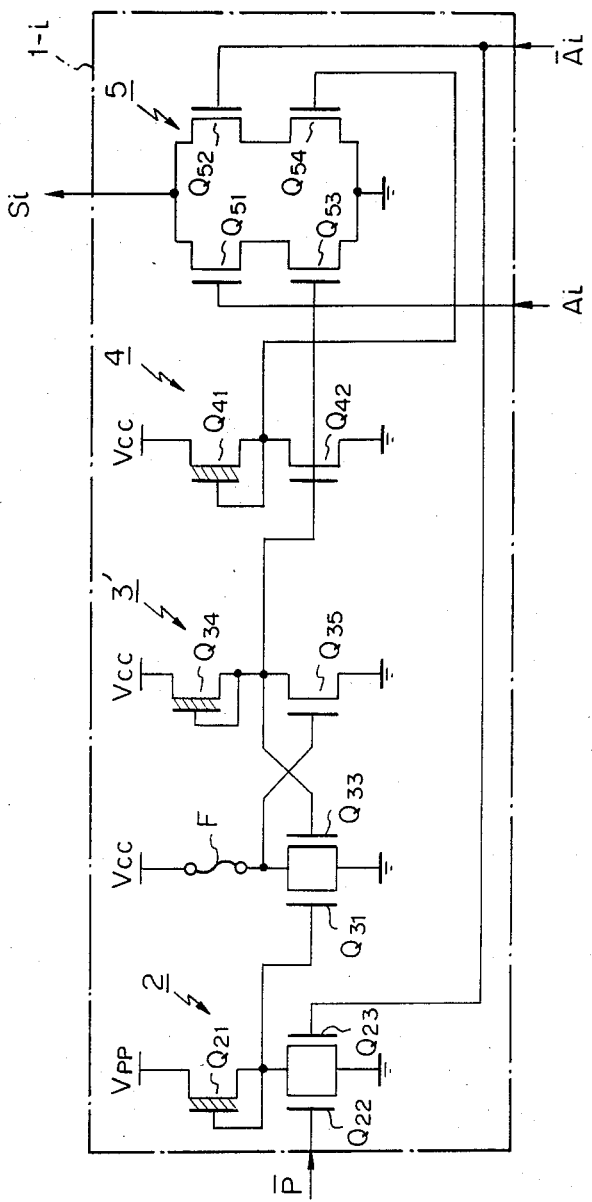

Another example of a prior art ROM 1-i, referring to the disclosure in Electronics, July 28, P. 123, is illustrated in FIG. 3. An information storing circuit 3' includes a latch circuit. That is, an enhancement-type transistor $Q_{33}$, a depletion-type transistor $Q_{34}$, and an enhancement-type transistor $Q_{35}$ are provided instead of the depletion-type transistor $Q_{32}$ of FIG. 2, thereby increasing the tolerance of the ratio of the blown and unblown resistances of the fuse F.

Figure 4:
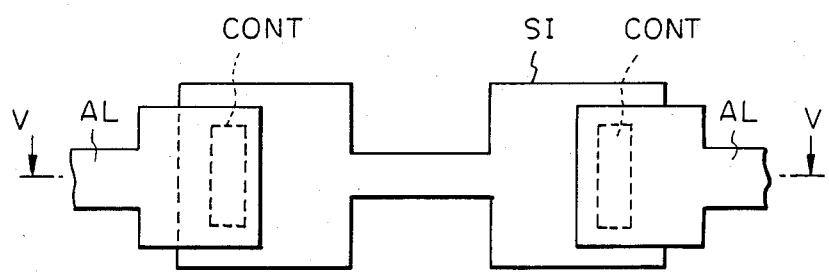
FIG. 4 is a plan view of the fuse of FIGS. 2 and 3.
Figure 5A:
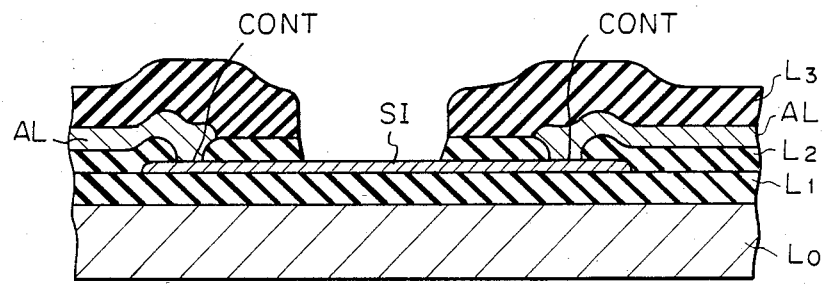
FIGS. 5A and 5B are cross-sectional views taken along the V—V line of FIG. 4.

The fuse F as shown in FIGS. 2 and 3 includes, for example, a polycrystalline silicon layer SI, as illustrated in FIG. 4. The polycrystalline silicon layer SI is connected via a contact area CONT to an aluminum layer AL serving as a conductive layer. The blowing portion of the fuse F is, for example, 2 μm wide and 8 μm long. As illustrated in FIG. 5A, at the blowing portion, the polycrystalline silicon layer SI is exposed so as to evaporate the blown polycrystalline silicon during a blowing step, thereby avoiding recovery of the connection, i.e., recovery from the blown state to the unblown state. In this case, however contaminants such as sodium ions penetrating into a monocrystalline silicone substrate $L_0$ increase so as to interfere with the circuit operation.

Figure 5B:
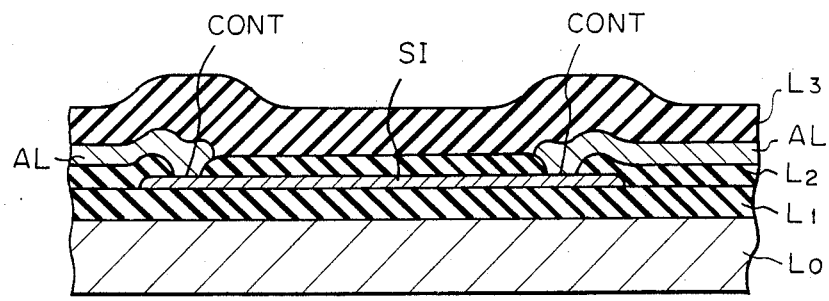

On the other hand, as illustrated in FIG. 5B, blowing can be carried out while covering the blowing portion with an insulating layer. In this case, however, the polycrystalline silicon of the blowing portion may not complete its evaporation, thereby increasing the risk of the recovery of the blown polycrystalline silicon.

In FIGS. 5A and 5B, note that $L_1$, $L_2$, and $L_3$ designate insulating layers such as silicon dioxide ($SiO_2$) or phosphosilicate glass (PSG).

In any case, a major phenomenon which results in the defect of the electrical recovery of the blown fuse is migration of the remaining fuse material due to a high electric field across the blown gap. The fuses are not always blown uniformly or perfectly. There may be a high electrical resistance between terminals of the blown fuse, even though the blown gap is extremely narrow, for example, several hundred Angstroms (Å). Generally, in an inspection, it is difficult to detect the narrowness of a gap of a fuse blown at the programming step. Consequently, an inferior semiconductor IC device having such a narrow gap of a blown fuse cannot be previously discriminated. As the voltage of the power supply, for example, 5 V (DC), is applied between the terminals of the blown fuse, a strong electric field is applied to the narrow gap. As a result, a conductive material, i.e., the polycrystalline silicon forming the fuse F, may be gradually displaced along the electric field direction to form a short-circuit at the fuse F. The electrical recovery of the blown fuse caused by the above-mentioned migration depends on the strength of the electric field. With a low strength electric field, the effect on electrical recovery can be substantially neglected. On the other hand, a stronger electric field may cause recovery. As the strength of the electric field increases, the probability of occurrence of recovery may drastically increase, resulting in an inferior semiconductor IC device.

The present invention relates to an improvement of the semiconductor IC device which protects against the adverse effects of recovery of a blown fuse.

Figure 6:
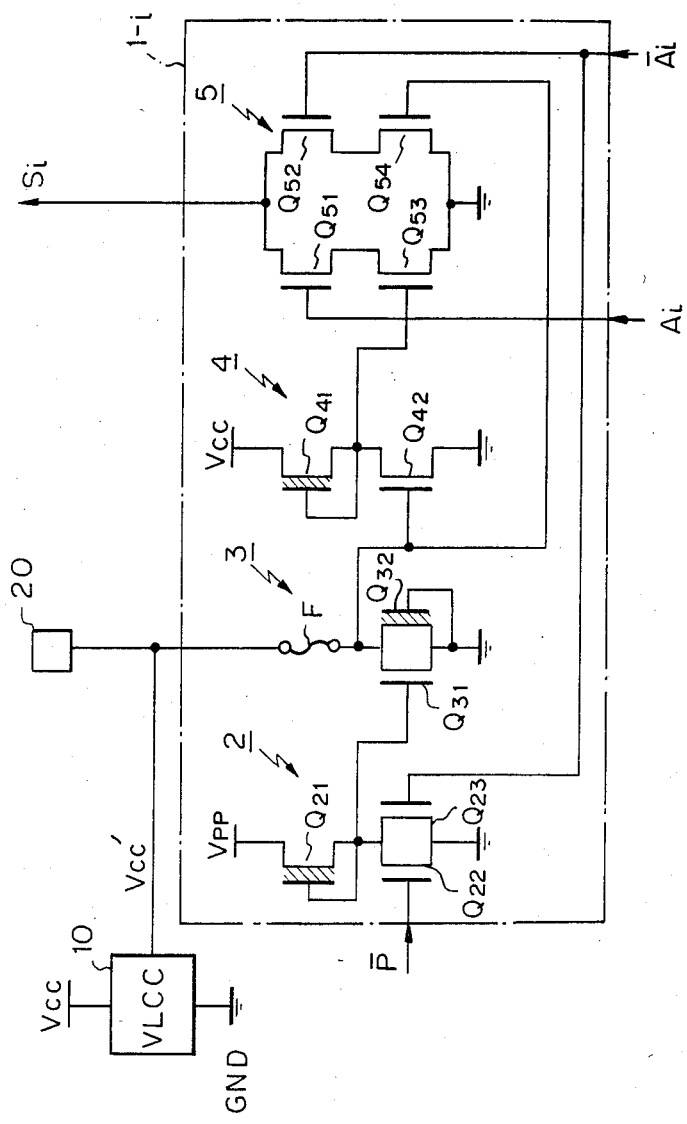
FIG. 6 is a circuit diagram of a fuse-type ROM including an embodiment of the information sensing circuit according to the present invention.

FIG. 6 is a circuit diagram of an embodiment of a semiconductor IC circuit including the information storing circuit 3. In FIG. 6, the semiconductor IC circuit including the ROM 1-i is provided with a voltage level conversion circuit 10, connected between the voltage feed line $V_{CC}$ ($V_{CC}$ also designates the power supply voltage) and the ground GND and having an output terminal connected to one terminal of the fuse F, and a probing pad 20, also connected to the one terminal of the fuse F. Other elements in FIG. 6 are substantially identical to those in FIG. 2 and bear the same reference as in FIG. 2.

When the programming is effected to store the information of the defective memory row or column, a probe having the voltage of the power supply voltage $V_{CC}$, for example, 5 V, or the programming voltage $V_{PP}$ higher than the voltage $V_{CC}$ is brought into contact with the probing pad 20. The fuse F may be blown by the large current passing therethrough when the programming signal $\overline{P}$ coincides with the address signal $\overline{A}_i$ to turn the transistor $Q_{31}$ on.

After that, one terminal of the blown fuse F is supplied with the voltage $V_{CC}'$ from the voltage level conversion circuit 10. The voltage level conversion circuit 10 receives the power supply voltage $V_{CC}$ and outputs the above voltage $V_{CC}'$ which is lower than the power supply voltage $V_{CC}$.

Figure 7:
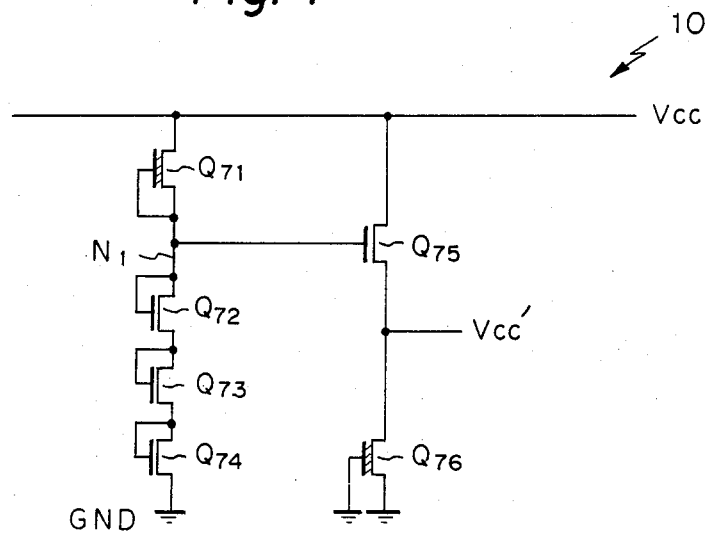
FIG. 7 is a circuit diagram of an embodiment of a voltage level conversion circuit shown in FIG. 6.

FIG. 7 is a circuit diagram of the voltage level conversion circuit 10 of an embodiment. In FIG. 7, the voltage level conversion circuit 10 consists of series-connected depletion-type transistor $Q_{71}$ and enhancement-type transistors $Q_{72}$ and $Q_{74}$. The voltage level conversion circuit 10 also consists of series-connected enhancement-type transistor $Q_{75}$ and depletion-type transistor $Q_{76}$. A drain of the depletion-type transistor $Q_{71}$ is connected to the voltage feed line $V_{CC}$, while a gate and a source of the transistor $Q_{71}$ are joined at a node $N_1$. A gate and a drain of each transistor $Q_{72}$ to $Q_{74}$ are connected. A source of the transistor $Q_{74}$ is connected to the ground GND. Therefore, the series-connected transistors $Q_{71}$ to $Q_{74}$ provided between the voltage feed line $V_{CC}$ and the ground GND may function as a voltage divider. The transistor $Q_{71}$ may function as a current limiting element. A drain of the transistor $Q_{75}$ is connected to the voltage feed line $V_{CC}$ as a current control element, and a gate thereof is connected to the node $N_1$. A drain of the transistor $Q_{76}$ is connected to a source of the transistor $Q_{75}$, and their common connected point is connected to the one terminal of the blown fuse F. A gate and a source of the transistor $Q_{76}$ are both connected to the ground GND. As a result, the transistor $Q_{76}$ may function as a dropping resistor.

The enhancement-type transistors $Q_{72}$ to $Q_{75}$ have a gate threshold voltage of 1 V, respectively, and have sufficiently larger gate widths than those of the depletion-type transistors $Q_{71}$ and $Q_{76}$.

Figure 8:
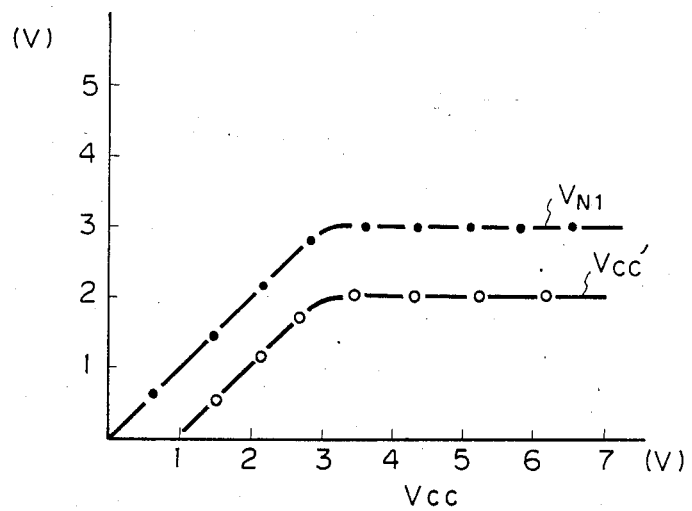
FIG. 8 is a graph explaining the operation of the circuit shown in FIG. 7.

FIG. 8 is a graph of the characteristic of the relationship between the power supply voltage $V_{CC}$ and voltage $V_{N1}$ at the node $N_1$ and $V_{CC}'$ at the output terminal. As the power supply voltage $V_{CC}$ increases, the voltage $V_{N1}$ at the node will increase. The voltage $V_{CC}'$ at the output terminal may be increased in response to the increment of the voltage $N_{N1}$. When the voltage $V_{CC}$ exceeds 3 V, the current passing through the transistor $Q_{71}$ is limited to keep the voltage $V_{N1}$ at 3 V. As a result, a current passing through the transistor $Q_{75}$ is maintained at a certain value to output voltage $V_{CC}'$ having a constant value 1 V lower than the voltage $V_{N1}$, that is, a constant value 1 V lower than the voltage $V_{N1}$, that is, $V_{CC}' = 2$ V, regardless of the change of the load, i.e., the blown or unblown state of the fuse F.

After programming the information, the one terminal of the fuse F is supplied with the voltage $V_{CC}'$, which is lower than the voltage $V_{CC}$, for example, $V_{CC}' = 2$ V and $V_{CC} = 5$ V. Accordingly, the electric field applicable to the blown portion of the fuse F is considerably reduced. As a result, the probability of the recovery of the blown fuse, particularly a fuse blown imperfectly, due to migration is reduced. This clearly improves the reliability of a semiconductor IC device including a blown fuse-type information storing circuit.

It is preferable, on one hand, that the voltage $V_{CC}'$ output from the voltage level conversion circuit be as low as possible so as to restrain the migration effect due to a high electric field. On the other hand, the voltage $V_{CC}'$ must be a predetermined value which is sufficient to sense the blown or unblown state of the fuse at the inverter 4 as the information detection circuit. That is, the voltage $V_{CC}'$ must be higher than the threshold voltage $V_{TH}$ of the driver transistor $Q_{42}$ in the inverter 4. It is also preferable that the voltage $V_{CC}'$ be kept at the predetermined level mentioned-above regardless if the fuse is blown or unblown.

The inverter 4 outputs a sensed signal, which is lower than the power supply voltage $V_{CC}$ by the threshold voltage $V_{TH}$ of the transistor $Q_{41}$ therein, to the gate of the transistor $Q_{53}$ in response to the voltage at other terminal of the fuse F. Likewise, the gate circuit 5 which includes transistor $Q_{54}$ having a gate connected to the other terminal of the fuse F outputs a logic signal having a level corresponding to the voltage $V_{CC}$ at node $S_i$ depending upon the voltage level of the other terminal. That is, either the inverter 4 or circuit 5 substantially functions as an information sensing and signal level converting circuit which provides a logic signal having a level corresponding to the power supply voltage $V_{CC}$ eventually required to drive the other internal circuit based on the voltage of the other terminal of the fuse F having a relatively low level corresponding to the voltage $V_{CC}'$.

Figure 9:
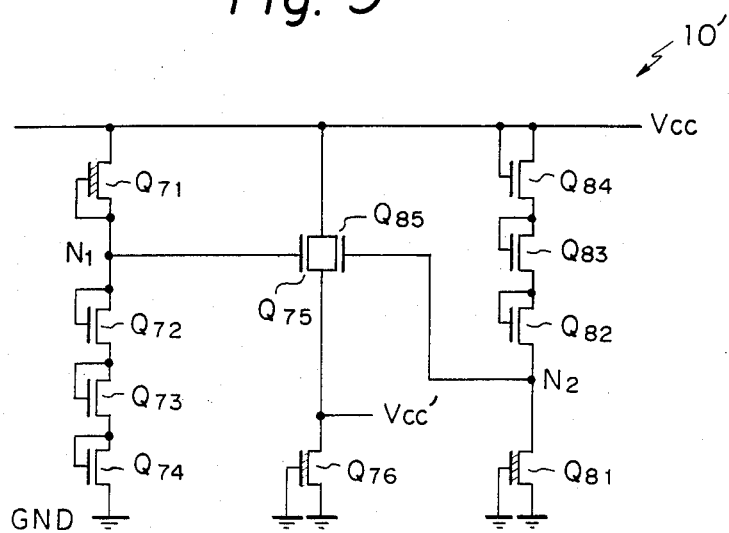
FIG. 9 is a circuit diagram of another embodiment of the voltage level conversion circuit shown in FIG. 6.

FIG. 9 is a circuit diagram of another embodiment of the voltage level conversion circuit 10'. In FIG. 9, the voltage level conversion circuit 10' further includes an enhancement-type transistor $Q_{85}$ parallel-connected to the enhancement-type transistor $Q_{75}$, series-connected enhancement-type transistors $Q_{82}$ to $Q_{84}$, and a depletion-type transistor $Q_{81}$ joined to a source of the transistor $Q_{82}$ at a node $N_2$. A gate of the transistor $Q_{85}$ is connected to the node $N_2$. The transistors $Q_{71}$ to $Q_{86}$ are identical to those in the voltage level conversion circuit 10 shown in FIG. 7 and bear the same references.

The voltage level conversion circuit 10 may be further modified to be connected to only one of two power supply lines $V_{CC}$ and the ground, if an appropriate voltage shift means which outputs a lower voltage between its output node and the other of the two power supply lines is used.

Figure 10:
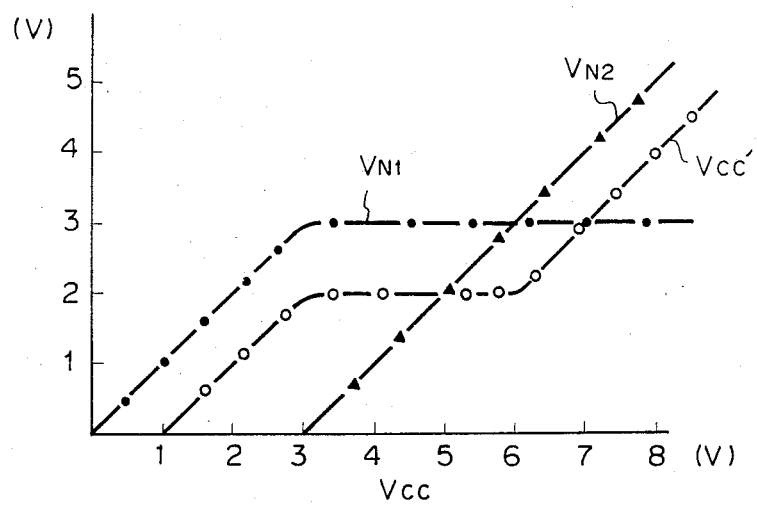
FIG. 10 is a graph explaining the operation of the circuit shown in FIG. 9.

FIG. 10 is a graph of the characteristic of the relationship between the power supply voltage $V_{CC}$ and the voltage $V_{N1}$ at the note $N_1$, $V_{N2}$ at the node $N_2$ and $V_{CC}'$ at the output terminal. Until the voltage $V_{CC}$ reaches 6 V, the relationship between the voltage $V_{CC}$ and the voltages $V_{N1}$ and $V_{CC}'$ is similar to that in FIG.

8, since the voltage $V_{N2}$ is zero and the transistor $Q_{85}$ is still off.

As the voltage $V_{CC}$ increases, exceeding 3 V, the voltage $V_{N2}$ may increase, however, the voltage $V_{N1}$ is kept at 3 V, as mentioned before. The voltage $V_{N2}$, however, is not sufficient to turn the transistor $Q_{85}$ on, whereby the voltage $V_{CC}'$ is kept at 2 V.

When the voltage $V_{CC}$ exceeds 6 V, the voltage $V_{N2}$ reaches 3 V, which is sufficient to turn the transistor $Q_{85}$ on. Accordingly, the current passing through the depletion-type transistor $Q_{76}$, functioning as a resistor, may increase to lift the voltage $V_{CC}'$. This differs from the operation of the voltage level conversion circuit 10 shown in FIG. 7.

Accompanying the ascent of the voltage $V_{CC}$, the voltage $V_{CC}'$ may rise linearly.

Clearly, the rated value of the power supply voltage $V_{CC}$ at both voltage level conversion circuits 10 and 10' in a normal operation mode is the same, for example, $V_{CC}=5$ V. Accordingly, the voltage $V_{CC}'$ output from the voltage level conversion circuit 10' shown in FIG. 9 is as low as the voltage $V_{CC}'$ output from the voltage level conversion circuit 10 shown in FIG. 7 when the voltage $V_{CC}$ is the rated value, so that the voltage $V_{CC}'$ output from the voltage level conversion circuit 10' also contributes to reduce the adverse effect of the migration of fuse material due to the high electric field. In addition, the voltage level conversion circuit 10' is beneficial for investigating the reliability of the semiconductor IC device in question, for screening tests, and for acceleration tests, by applying a higher voltage $V_{CC}$, for example, 7 V, rather than the rated value.

Figure 11:
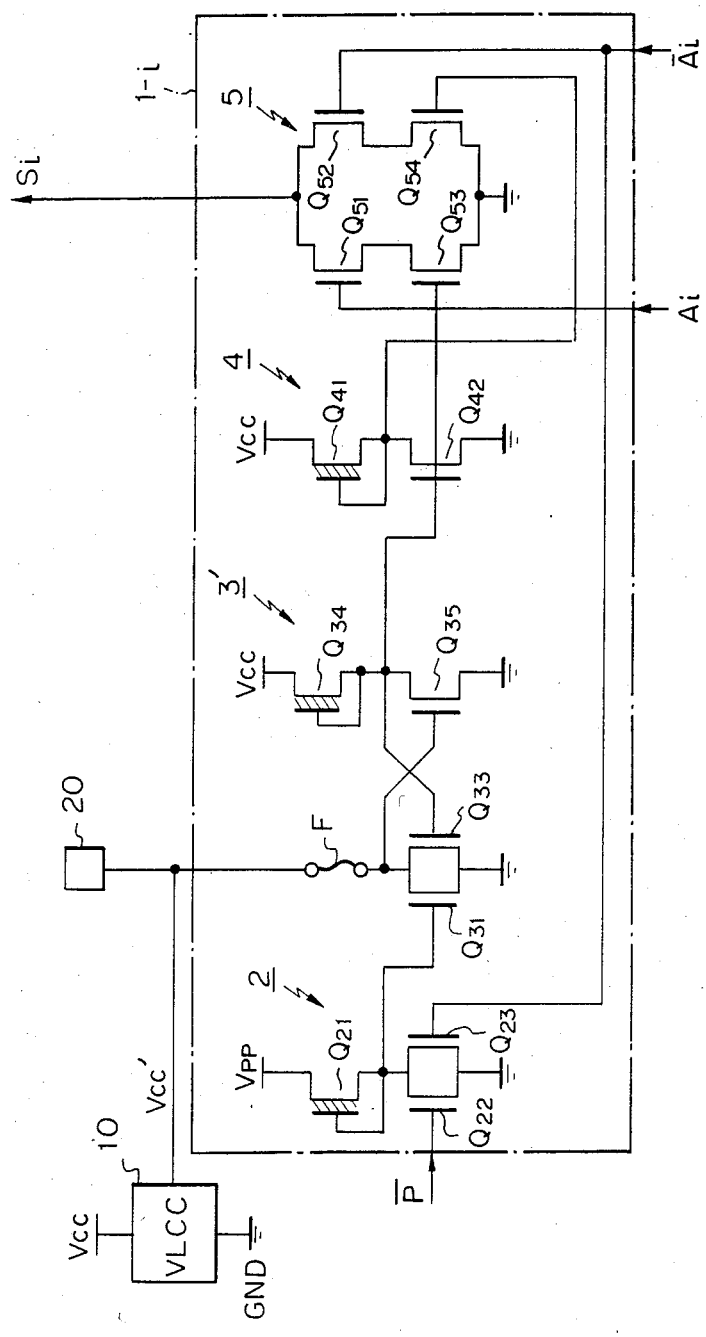
FIG. 11 is a circuit diagram of another fuse-type ROM including an embodiment of the information sensing circuit.

FIG. 11 is a circuit diagram of another embodiment of the semiconductor IC circuit including the latch-type information storing circuit 3'. In FIG. 11, the ROM 1-i in the semiconductor IC device corresponds to that shown in FIG. 3, the circuit elements bearing the same references. The semiconductor IC, like the other embodiment, includes the voltage level conversion circuit 10 and the probing pad 20. The output terminals of the voltage level conversion circuit 10 and the probing pad 20 are both connected to one terminal of the blown or unblown fuse F in the latch-type circuit 3'.

As is clearly understood, the voltage level conversion circuit 10 shown in FIG. 7 or 10' in FIG. 9 can be applied for the voltage level conversion circuit 10 shown in FIG. 11.

The operation for storing the information by blowing fuses, for sensing the stored information, and for optional testing of the semiconductor IC device is similar to that set forth above. Accordingly, an explanation thereof is omitted.

Many widely different embodiments of the present invention may be constructed without departing from the spirit and scope of the present invention. It should be understood that the present invention is not limited to the specific embodiments described in this specification, except as defined in the appended claims.

We claim:

1. A semiconductor integrated circuit device connected between first and second voltage feed means, comprising:
    information storing means including a fuse for storing information by blowing or not blowing said fuse and for providing a corresponding output depending on whether or not said fuse has been blown;
    a voltage level conversion means, coupled to at least one of the first and second voltage feed means, for outputting a voltage to said information storing means that lies between the voltages of said first and second voltage feed means;
    detection means, coupled to said information storing means, for outputting a detection signal in response to said output of said information storing means.

2. A semiconductor integrated circuit device according to claim 1, wherein said voltage level conversion means includes a voltage divider connected between the first and second voltage feed means.

3. A semiconductor integrated circuit device according to claim 2, wherein said voltage divider in the voltage level conversion means includes at least one depletion-type transistor as a current limiting resistor and at least one enhancement-type transistor as a resistor, the resistance of said depletion-type and enhancement-type transistor defining voltage output therefrom.

4. A semiconductor integrated circuit device according to claim 1, wherein the voltage output from said voltage level conversion means is maintained at a predetermined value when the voltage between the first and the second voltage feed means exceeds a predetermined value.

5. A semiconductor integrated circuit device according to claim 4, wherein
    said voltage level conversion means includes a current limiting element coupled between the first and second voltage feed means, a current control element, and a resistor element connected in series with said current control element, and
    the current control element is controlled by an output from one terminal of the current limiting element to control a current passing through the resistor element.

6. A semiconductor integrated circuit device according to claim 4, wherein the maximum voltage output from the voltage level conversion means is kept at a predetermined value regardless of whether the fuse is blown or not blown.

7. A semiconductor integrated circuit device according to claim 1, wherein, in normal operation, said voltage output from said voltage level conversion means is set sufficiently low to effectively restrain migration caused at the vicinity of the fuse when blown, and higher than a threshold voltage for operation of said information detection means.

8. A semiconductor integrated circuit device according to claim 7, wherein
    said voltage level conversion means includes a voltage divider coupled between the first and second voltage feed means and having a current limiting element, a current control element, and a resistor element connected in series with said current control element, and
    the current control element is driven by an output voltage from one terminal of the current limiting element to control a current passing through the resistor element.

9. A semiconductor integrated circuit device according to claim 1, wherein
    said voltage output from said voltage level conversion means is maintained at a predetermined value when the voltage between the first and second voltage feed means is within a predetermined range, and
    said voltage output from said voltage level conversion means increases in response to the increment of voltage between the first and second voltage feed means when said voltage exceeds said predetermined range.

10. A semiconductor integrated circuit device according to claim 9, said voltage level conversion means comprising
- a first voltage divider coupled between the first and second voltage feed means and having a first current limiting element,
- a first current control element,
- a second current control element connected in parallel with said first current control element,
- a resistor element connected in series with said first and second current control elements, and
- a second voltage divider coupled between the first and second voltage feed means and having a second current limiting element, wherein the first current control element is driven by an output voltage of the first current limiting element, prior to the driving of the second current control element, and the second current control element is driven by an output voltage from the second current limiting element after the current passing through the first current control element is saturated, and the sum of currents passing through the first and second current control elements flows to the resistor element.

11. A semiconductor integrated circuit device according to claim 1, further comprising a terminal means connected to one end of said fuse in said information storing means for enabling external application of a voltage sufficient to blow the fuse.

12. A semiconductor integrated circuit device according to claim 1, wherein said information detecting means is an inverter circuit having a predetermined threshold level for its operation that is lower than said voltage output from said voltage level conversion means.

13. A semiconductor integrated circuit device according to claim 1, wherein said information storing means is a non-latched type circuit.

14. A semiconductor integrated circuit device according to claim 1, wherein said information storing means is a latch-type circuit.

15. A semiconductor integrated circuit device according to claim 1, wherein said fuse is formed in a cavity defined by insulating layers and has two ends each connected to a respective conductive member.

* * * * *

UNITED STATES PATENT AND TRADEMARK OFFICE
CERTIFICATE OF CORRECTION

PATENT NO. : 4,707,806
DATED : NOVEMBER 17, 1987
INVENTOR(S) : YOSHIHIRO TAKEMAE ET AL.

It is certified that error appears in the above-identified patent and that said Letters Patent is hereby corrected as shown below:

Col. 2, line 20, "for" should be --and--;

line 21, "lines and" should be --lines, for--.

Signed and Sealed this

Tenth Day of May, 1988

Attest:

DONALD J. QUIGG

Attesting Officer

Commissioner of Patents and Trademarks